(12) United States Patent
He et al.

(10) Patent No.: US 12,125,847 B2
(45) Date of Patent: Oct. 22, 2024

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Qingyuan He, Suzhou (CN); Ronghui Hao, Suzhou (CN); Fu Chen, Suzhou (CN); Jinhan Zhang, Suzhou (CN); King Yuen Wong, Suzhou (CN)

(73) Assignee: INNOSCIENCE (SUZHOU) TECHNOLOGY CO., LTD., Suzhou (CN)

(*) Notice: Subject to any disclaimer, the term of this patent is extended or adjusted under 35 U.S.C. 154(b) by 0 days.

(21) Appl. No.: 17/618,897

(22) PCT Filed: Nov. 12, 2021

(86) PCT No.: PCT/CN2021/130454
§ 371 (c)(1),
(2) Date: Dec. 14, 2021

(87) PCT Pub. No.: WO2023/082203
PCT Pub. Date: May 19, 2023

(65) Prior Publication Data
US 2024/0063218 A1 Feb. 22, 2024

(51) Int. Cl.
*H01L 27/085* (2006.01)
*H01L 21/8252* (2006.01)
*H01L 23/522* (2006.01)

(52) U.S. Cl.
CPC ........ *H01L 27/085* (2013.01); *H01L 21/8252* (2013.01); *H01L 23/5221* (2013.01)

(58) Field of Classification Search
None
See application file for complete search history.

(56) References Cited

U.S. PATENT DOCUMENTS

2009/0206363 A1    8/2009   Machida et al.
2012/0287688 A1*  11/2012   Fornage .............. H03K 17/693
                                                327/429
(Continued)

FOREIGN PATENT DOCUMENTS

CN    106653837 A    5/2017
CN    108183102 A    6/2018
(Continued)

OTHER PUBLICATIONS

International Search Report and Written Opinion of the corresponding PCT application No. PCT/CN2021/130454 mailed on Jun. 29, 2022.

(Continued)

*Primary Examiner* — Bilkis Jahan
(74) *Attorney, Agent, or Firm* — Li & Cai Intellectual Property (USA) Office

(57) ABSTRACT

A nitride-based semiconductor device includes a first nitride-based semiconductor layer, a second nitride-based semiconductor layer, a first nitride-based transistor, and a second nitride-based transistor. The first nitride-based transistor applies the 2DEG region as a channel thereof and comprising a first drain electrode that makes contact with the second nitride-based semiconductor layer to form a first Schottky diode with the second nitride-based semiconductor layer. The second nitride-based transistor applies the 2DEG region as a channel thereof and includes a second drain electrode that makes contact with the second nitride-based semiconductor layer to form a second Schottky diode with the second nitride-based semiconductor layer, such that the (Continued)

first Schottky diode and the second Schottky diode are connected to the same node.

19 Claims, 7 Drawing Sheets

(56) References Cited

U.S. PATENT DOCUMENTS

| | | | |
|---|---|---|---|
| 2013/0009165 | A1 | 1/2013 | Park et al. |
| 2014/0252370 | A1 | 9/2014 | Kwak et al. |
| 2014/0306235 | A1 | 10/2014 | Decoutere et al. |
| 2014/0375372 | A1* | 12/2014 | Ikeda ............... H01L 25/072 327/333 |
| 2016/0079233 | A1* | 3/2016 | Deboy ............... H01L 29/872 327/427 |
| 2016/0284815 | A1* | 9/2016 | Jiang ................. H01L 23/291 |

FOREIGN PATENT DOCUMENTS

| | | |
|---|---|---|
| CN | 108807510 A | 11/2018 |
| CN | 112331719 A | 2/2021 |
| CN | 112470289 A | 3/2021 |
| CN | 112740418 A | 4/2021 |
| JP | 2010166793 A | 7/2010 |

OTHER PUBLICATIONS

State Intellectual Property Office of the People's Republic of China, Office Action and Search Report Issued in Application No. 2021800042549, Dec. 1, 2023, 22 pages, (Submitted with Machine Translation).

* cited by examiner

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having at least two nitride-based transistors connected in series, and each of the nitride-based transistors is integrated with a Schottky diode.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

Due to characteristics of gallium nitride (GaN), GaN-based devices can be applied to different circuits, for example, a DC-DC conversion circuit, a DC-AC conversion circuit and an AC-AC conversion circuit. In particular, with respect to the AC-AC conversion circuit, it needs to use a bidirectional switch circuit to facilitate its circuit function. Accordingly, how to put HEMTs into a circuit to constitute a bidirectional switch circuit becomes one of the research directions.

SUMMARY OF THE DISCLOSURE

In accordance with one aspect of the present disclosure, a nitride-based semiconductor device is provided. The nitride-based semiconductor device includes a first nitride-based semiconductor layer, a second nitride-based semiconductor layer, a first nitride-based transistor, and a second nitride-based transistor. The second nitride-based semiconductor layer is disposed on the first nitride-based semiconductor layer and has a bandgap greater than a bandgap of the first nitride-based semiconductor layer, so as to form a heterojunction and a two-dimensional electron gas (2DEG) region adjacent to the heterojunction. The first nitride-based transistor applies the 2DEG region as a channel thereof and includes a first drain electrode that makes contact with the second nitride-based semiconductor layer to form a first Schottky diode with the second nitride-based semiconductor layer. The second nitride-based transistor applies the 2DEG region as a channel thereof and includes a second drain electrode that makes contact with the second nitride-based semiconductor layer to form a second Schottky diode with the second nitride-based semiconductor layer, such that the first Schottky diode and the second Schottky diode are connected to the same node.

In accordance with one aspect of the present disclosure, a method for manufacturing a nitride-based semiconductor device is provided. The method includes steps as follows. A second nitride-based semiconductor layer is formed on a first nitride-based semiconductor layer. A first nitride-based transistor is formed over the second nitride-based semiconductor layer. A first Schottky contact is formed between a first drain electrode and the second nitride-based semiconductor layer. A first connection bridge is formed to connect the first drain electrode and a first source electrode of the first nitride-based transistor. A second nitride-based transistor is formed over the second nitride-based semiconductor layer. A second Schottky contact is formed between a second drain electrode and the second nitride-based semiconductor layer. A second connection bridge is formed to connect the second drain electrode and a second source electrode of the second nitride-based transistor.

In accordance with one aspect of the present disclosure, a nitride-based semiconductor device is provided. The nitride-based semiconductor device includes a first nitride-based semiconductor layer, a second nitride-based semiconductor layer, a first conductive layer, a second conductive layer, a first metal layer, a second metal layer, a first connection bridge, and a second connection bridge. The second nitride-based semiconductor layer is disposed on the first nitride-based semiconductor layer and has a bandgap greater than a bandgap of the first nitride-based semiconductor layer, so as to form a heterojunction and a two-dimensional electron gas (2DEG) region adjacent to the heterojunction. The first conductive layer is disposed above the second nitride-based semiconductor layer to make contact with the second nitride-based semiconductor layer, so as to form a first Schottky junction with the second nitride-based semiconductor layer. The second conductive layer is disposed above the second nitride-based semiconductor layer to make contact with the second nitride-based semiconductor layer, so as to form a second Schottky junction with the second nitride-based semiconductor layer. The first metal layer is disposed above the second nitride-based semiconductor layer to make contact with the second nitride-based semiconductor layer. The first conductive layer is located between the first metal layer and the second conductive layer. The second metal layer is disposed above the second nitride-based semiconductor layer to make contact with the second nitride-based semiconductor layer. The second conductive layer is located between the first conductive layer and the second metal layer. The first connection bridge electrically connects the first conductive layer to the first metal layer. The second connection bridge electrically connects the second conductive layer to the second metal layer.

Based on the above descriptions, in the present disclosure, the two nitride-based transistors can apply different parts of the 2DEG region as respective channels. Schottky diodes are introduced into the nitride-based transistors, in which cathodes of the Schottky diodes can be connected to the same node. By switching on or off of the nitride-based transistors and turning on or off the Schottky diodes, the semiconductor device can serve as a bidirectional switch circuit. It is advantageous to reduce the power consumption due to the introduction of the Schottky diodes.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
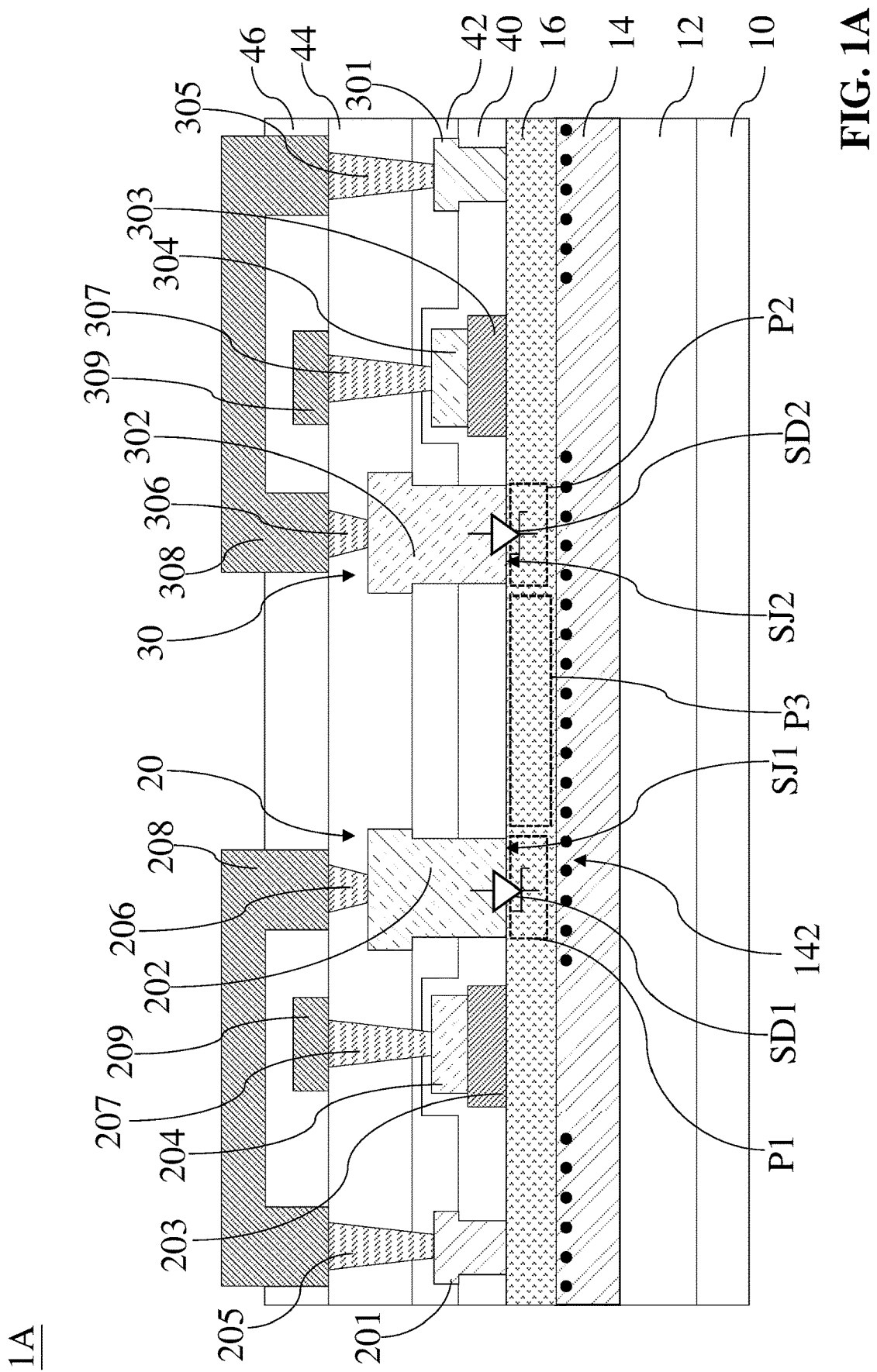
FIG. 1A is a vertical view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a vertical view of a semiconductor device 1A according to some embodiments of the present disclosure. The semiconductor device 1A includes a substrate 10, a buffer layer 12, nitride-based semiconductor layers 14, 16, and nitride-based transistors 20 and 30.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14. The buffer layer 12 can be configured to reduce lattice and thermal mismatches between the substrate 10 and the nitride-based semiconductor layer 14, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14 can be disposed on/over/above the substrate 10 and the buffer layer 12. The nitride-based semiconductor layer 14 can be in contact with the buffer layer 12. The nitride-based semiconductor layer 16 can be disposed on/over/above the nitride-based semiconductor layer 14. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$. The exemplary materials of the nitride-based semiconductor layer 16 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$.

The exemplary materials of the nitride-based semiconductor layers 14 and 16 are selected such that the nitride-based semiconductor layer 16 has a bandgap (i.e., forbidden band width) greater/higher than a bandgap of the nitride-based semiconductor layer 14, which causes electron affinities thereof different from each other and forms a heterojunction therebetween. For example, when the nitride-based semiconductor layer 14 is an undoped GaN layer having a bandgap of approximately 3.4 eV, the nitride-based semiconductor layer 16 can be selected as an AlGaN layer having bandgap of approximately 4.0 eV. As such, the nitride-based semiconductor layers 14 and 16 can serve as a channel layer and a barrier layer, respectively. A triangular well potential is generated at a bonded interface between the channel and barrier layers, so that electrons accumulate in the triangular well, thereby generating a two-dimensional electron gas (2DEG) region 142 adjacent to the heterojunction. Accordingly, the semiconductor device 1A is available to include at least one GaN-based high-electron-mobility transistor (HEMT).

Generally speaking, with respect to a design of a HEMT device, a distance between a gate electrode and a source electrode ($L_{gs}$) is designed to be less than that of a gate electrode and a drain electrode ($L_{gd}$) for reducing on-resistance ($R_{on}$). Such a design may weaken the reverse withstand voltage of the device. For example, when the aforesaid HEMT is applied to a bidirectional switch, the performance of the bidirectional switch cannot be further improved.

To cure such the issues, as considered of a HEMT that is provided with a gate electrode and a p-doped nitride-based semiconductor layer stacked on the gate electrode, the p-doped nitride-based semiconductor layer can form a PN diode with a barrier layer so as to serve as a factor for switching control. However, once the PN diode serves as the only factor for switching, the required turn-on voltage of the PN diode is large, such that the power consumption thereof is unable to be effectively reduced.

Alternatively, as considered of a HEMT that is provided with composite electrode material to form only an ohmic contact and a Schottky contact. However, it needs at least two aforesaid HEMTs to be connected in parallel for realizing the function of the bidirectional switch circuit, so such a configuration is unable to effectively reduce volume of the electronic device.

Hence, the aforesaid HEMTs cannot meet the trend of electronic miniaturization and the requirements of low power consumption.

At least to avoid the afore-mentioned issues, the present disclosure is to provide a novel structure of the HEMT.

The nitride-based transistor 20 includes electrodes 201, 202, a doped nitride-based semiconductor layer 203, a gate electrode 204, conductive vias (i.e., contact via) 205, 206, and 207, a connection bridge 208, and a conductive pad 209.

The electrodes 201 and 202 can be disposed on/over/above the nitride-based semiconductor layer 16. The electrodes 201 and 202 can make contact with the nitride-based semiconductor layer 16. The electrode 202 can make contact with a portion P1 of the nitride-based semiconductor layer 16. A thickness of the electrode 202 can be greater than that of the electrode 201, which results from the different formation stages.

In some embodiments, the electrode 201 can serve as a source electrode. In some embodiments, the electrode 201 can serve as a drain electrode. In some embodiments, the electrode 202 can serve as a source electrode. In some embodiments, the electrode 202 can serve as a drain electrode. The role of the electrodes 201 and 202 depends on the device design.

In some embodiments, the electrodes 201 and 202 can include, for example but are not limited to, metals, alloys, doped semiconductor materials (such as doped crystalline silicon), compounds such as silicides and nitrides, other conductor materials, or combinations thereof. The exemplary materials of the electrodes 201 and 202 can include, for example but are not limited to, titanium nitride (TiN), tantalum nitride (TaN), tungsten nitride (WN), tungsten (W), nickel (Ni), or combinations thereof. The exemplary materials of the electrodes 201 and 202 may be formed from metal alloy which may include, for example but are not limited to, titanium/gold (Ti/Au), titanium/aluminum/nickel/gold (Ti/Al/Ni/Au), or combinations thereof.

Each of the electrodes 201 and 202 may be a single layer, or plural layers of the same or different composition. In some embodiments, the electrode 201 can form ohmic contact with the nitride-based semiconductor layer 16. Furthermore, the ohmic contacts can be achieved by applying Ti, Al, or other suitable materials to the electrode 201.

In some embodiments, each of the electrodes 201 and 202 is formed by at least one conformal layer and a conductive filling. The conformal layer can wrap the conductive filling. The exemplary materials of the conformal layer include, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

In some embodiments, the exemplary materials of the electrodes 201 and 202 are selected such that the electrodes 201 and 202 can form contacts in different types with the nitride-based semiconductor layer 16. For example, the electrodes 201 and 202 may have different materials, such that the electrode 201 forms an ohmic contact with the nitride-based semiconductor layer 16 and that the electrode 202 forms a Schottky contact with the nitride-based semiconductor layer 16. In some embodiments, the electrode 201 is formed from a metal layer and the electrode 202 is formed from a conductive layer.

In response to the Schottky contact, the electrode 202 can form a Schottky diode SD1 with the nitride-based semiconductor layer 16. The electrode 202 and the nitride-based semiconductor layer 16 collectively form a Schottky junction SJ1. The Schottky diode SD1 is across the Schottky junction SJ1. Specifically, the electrode 202 serves as an anode for the Schottky diode SD1, and the portion P1 of the nitride-based semiconductor layer 16 in contact with the electrode 202 serves as a cathode for the Schottky diode SD1.

By controlling the manufacturing process temperature of the electrode 202 under a room temperature, a metal-semiconductor junction between the electrode 202 and the nitride-based semiconductor layer 16 can be formed to be the Schottky junction SJ1. Therefore, the Schottky diode SD1 is integrated into the nitride-based transistor 20.

The doped nitride-based semiconductor layer 203 can be disposed on/over/above the nitride-based semiconductor layer 16. The doped nitride-based semiconductor layer 203 can be in contact with the nitride-based semiconductor layer 16. The doped nitride-based semiconductor layer 203 can be disposed/located between the electrodes 201 and 202. The gate electrode 204 is disposed on/over/above the doped nitride-based semiconductor layer 203. The gate electrode 204 is in contact with the doped nitride-based semiconductor layer 203. The gate electrode 204 and the doped nitride-based semiconductor layer 203 can be referred to as a gate structure.

A width of the doped nitride-based semiconductor layer 203 is greater than that of the gate electrode 204. In some embodiments, a width of the doped nitride-based semiconductor layer 203 is substantially the same as a width of the gate electrode 204. The profiles of the doped nitride-based semiconductor layer 203 and the gate electrode 204 are the same, for example, both of them are rectangular profiles. In other embodiments, the profiles of the doped nitride-based semiconductor layer 203 and the gate electrode 204 can be different from each other, for example, the profile of the doped nitride-based semiconductor layer 203 can be a trapezoid profile, while the profile of the gate electrode 204 can be a rectangular profile.

The doped nitride-based semiconductor layer 203 can be a p-type doped III-V semiconductor layer. The exemplary materials of the doped nitride-based semiconductor layer 203 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg.

The exemplary materials of the gate electrode 204 may include metals or metal compounds. The gate electrode 204 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The conductive via 205 can be disposed on/over/above the electrode 201. The conductive via 205 can make a contact with the electrode 201. The conductive via 206 is disposed on/over/above the electrode 202. The conductive via 206 can make a contact with the electrode 202. The conductive via 207 can be disposed on/over/above the gate electrode 204. The conductive via 207 can make a contact with the gate electrode 204. The conductive via 207 can be located between the two conductive vias 205 and 206. The exemplary materials of the conductive vias 205, 206 and 207 can include, for example but are not limited to, conductive materials, such as metals or alloys.

The connection bridge 208 can be disposed on/over/above the conductive vias 205, 206 and 207. The connection bridge 208 can extend across the gate electrode 203 and the doped nitride-based semiconductor layer 204 (i.e., the gate structure). The connection bridge 208 can have two opposite end portions. One of the end portions of the connection bridge 208 can be in contact with the conductive via 205, and another one of the end portions of the connection bridge 208 can be in contact with the conductive via 206. The electrode 201 can be electrically connected to the electrode 202 through the connection bridge 208, the conductive vias 205 and 206. The exemplary materials of the connection bridge 208 can include, for example but are not limited to, conductive materials, such as metals or alloys.

The conductive pad 209 can be disposed on/over/above the conductive via 207 and the gate electrode 204. The conductive pad 209 can be in contact with the conductive via 207, so as to electrically connect to the gate electrode 204 through the conductive via 207. An external electronic device can apply a bias to the conductive pad 209, so as to control the voltage level of the gate electrode 204. The exemplary materials of the conductive pad 209 can include, for example but are not limited to, conductive materials, such as metals or alloys.

The nitride-based transistor 30 includes electrodes 301, 302, a doped nitride-based semiconductor layer 303, a gate electrode 304, conductive vias 305, 306, and 307, a connection bridge 308, and a conductive pad 309.

The electrodes 301 and 302 can be disposed on/over/above the nitride-based semiconductor layer 16. The electrodes 301 and 302 can make contact with the nitride-based semiconductor layer 16. The electrode 302 can make contact with a portion P2 of the nitride-based semiconductor layer 16. A thickness of the electrode 302 can be greater than that of the electrode 301, which results from the different formation stages.

In some embodiments, the electrode 301 can serve as a source electrode. In some embodiments, the electrode 301 can serve as a drain electrode. In some embodiments, the electrode 302 can serve as a source electrode. In some embodiments, the electrode 302 can serve as a drain electrode. The role of the electrodes 301 and 302 depends on the device design. The exemplary material of the electrodes 301 and 302 can be identical with or similar with that of the electrodes 201 and 202.

The configuration of the electrodes 301 and 302 can be identical with or similar with that of the electrodes 201 and 202.

In some embodiments, the exemplary materials of the electrodes 301 and 302 are selected such that the electrodes 301 and 302 can form contacts in different types with the nitride-based semiconductor layer 16. For example, the electrodes 301 and 302 may have different materials such that the electrode 301 forms an ohmic contact with the nitride-based semiconductor layer 16 and that the electrode 302 forms a Schottky contact with the nitride-based semiconductor layer 16. In some embodiments, the electrode 301 is formed from a metal layer and the electrode 302 is formed from a conductive layer.

In response to the Schottky contact, the electrode 302 can form a Schottky diode SD2 with the nitride-based semiconductor layer 16. The electrode 302 and the nitride-based semiconductor layer 16 collectively form a Schottky junction SJ2. The Schottky diode SD2 is across the Schottky junction SJ2. Specifically, the electrode 302 serves as an anode for the Schottky diode SD2, and the portion P2 of the nitride-based semiconductor layer 16 in contact with the electrode 302 serves as a cathode for the Schottky diode SD2.

By controlling the manufacturing process temperature of the electrode 302 under a room temperature, a metal-semiconductor junction between the electrode 302 and the nitride-based semiconductor layer 16 can be formed to be a Schottky junction SJ2. Therefore, the Schottky diode SD2 is integrated into the nitride-based transistor 30.

The doped nitride-based semiconductor layer 303 can be disposed on/over/above the nitride-based semiconductor layer 16. The doped nitride-based semiconductor layer 303 can be in contact with the nitride-based semiconductor layer 16. The doped nitride-based semiconductor layer 303 can be disposed/located between the electrodes 301 and 302. The gate electrode 304 is disposed on/over/above the doped nitride-based semiconductor layer 303. The gate electrode 304 is in contact with the doped nitride-based semiconductor layer 303. The gate electrode 304 and the doped nitride-based semiconductor layer 303 can be referred to as a gate structure.

A width of the doped nitride-based semiconductor layer 303 is greater than that of the gate electrode 304. In some embodiments, a width of the doped nitride-based semiconductor layer 303 is substantially the same as a width of the gate electrode 304. The profiles of the doped nitride-based semiconductor layer 303 and the gate electrode 304 are the same, for example, both of them are rectangular profiles. In other embodiments, the profiles of the doped nitride-based semiconductor layer 303 and the gate electrode 304 can be different from each other, for example, the profile of the doped nitride-based semiconductor layer 303 can be a trapezoid profile, while the profile of the gate electrode 304 can be a rectangular profile.

The conductive type and exemplary materials of the doped nitride-based semiconductor layer 303 can be identical with or similar with that of the doped nitride-based semiconductor layer 203.

In some embodiments, the nitride-based semiconductor layer 14 includes undoped GaN and the nitride-based semiconductor layer 16 includes AlGaN, and the doped nitride-based semiconductor layers 203 and 303 are p-type GaN layers, which can bend the underlying band structure upwards and to deplete the corresponding zones of the 2DEG region 142, so as to place the semiconductor device 1A into an off-state condition.

The configuration and exemplary materials of the gate electrode 304 can be identical with or similar with that of the gate electrode 204.

The conductive via 305 can be disposed on/over/above the electrode 301. The conductive via 305 can make a contact with the electrode 301. The conductive via 306 is disposed on/over/above the electrode 302. The conductive via 306 can make a contact with the electrode 302. The conductive via 307 can be disposed on/over/above the gate electrode 304. The conductive via 307 can make a contact with the gate electrode 304. The conductive via 307 can be located between the two conductive vias 305 and 306. The exemplary materials of the conductive vias 305, 306 and 307 can be identical with or similar with that of the conductive vias 205, 206 and 207.

The connection bridge 308 can be disposed on/over/above the conductive vias 305, 306 and 307. The connection bridge 308 can extend across the gate electrode 303 and the doped nitride-based semiconductor layer 304 (i.e., the gate structure). The connection bridge 308 can have two opposite end portions. One of the end portions of the connection bridge 308 can be in contact with the conductive via 305, and another one of the end portions of the connection bridge 308 can be in contact with the conductive via 305. The electrode 301 can be electrically connected to the electrode 302 through the connection bridge 308, the conductive vias 305 and 306. The exemplary materials of the connection bridge 308 can be identical with or similar with that of the connection bridge 208.

The conductive pad 309 can be disposed on/over/above the conductive via 307 and the gate electrode 304. The conductive pad 309 can be in contact with the conductive via 307, so as to electrically connect to the gate electrode 304 through the conductive via 307. An external electronic device can apply a bias to the conductive pad 309, so as to control the voltage level of the gate electrode 304. The exemplary materials of the conductive pad 309 can be identical with or similar with that of the conductive pad 209.

The nitride-based transistor 20 applies a part of the 2DEG region 142 as a channel thereof. The nitride-based transistor 30 applies other part of the 2DEG region 142 as a channel thereof. That is, the nitride-based transistors 20 and 30 apply the different parts of the 2DEG region 142 in the same nitride-based semiconductor layer 14. The nitride-based transistors 20 and 30 share the same nitride-based semiconductor layer 14 (i.e., channel layer).

With respect to the relationship between the nitride-based transistors 20 and 30, the electrodes 202 and 302 are located between the two gate electrodes 204 and 304. The electrode 202 is located between the gate electrode 204 and the electrode 302. The electrode 302 is located between the gate electrode 304 and the electrode 202. Furthermore, the nitride-based semiconductor layer 16 has a portion P3 between the portions P1 and P2. In the nitride-based semiconductor layer 16, the portion P3 connects the portion P1 to the portion P2.

Figure 1B:
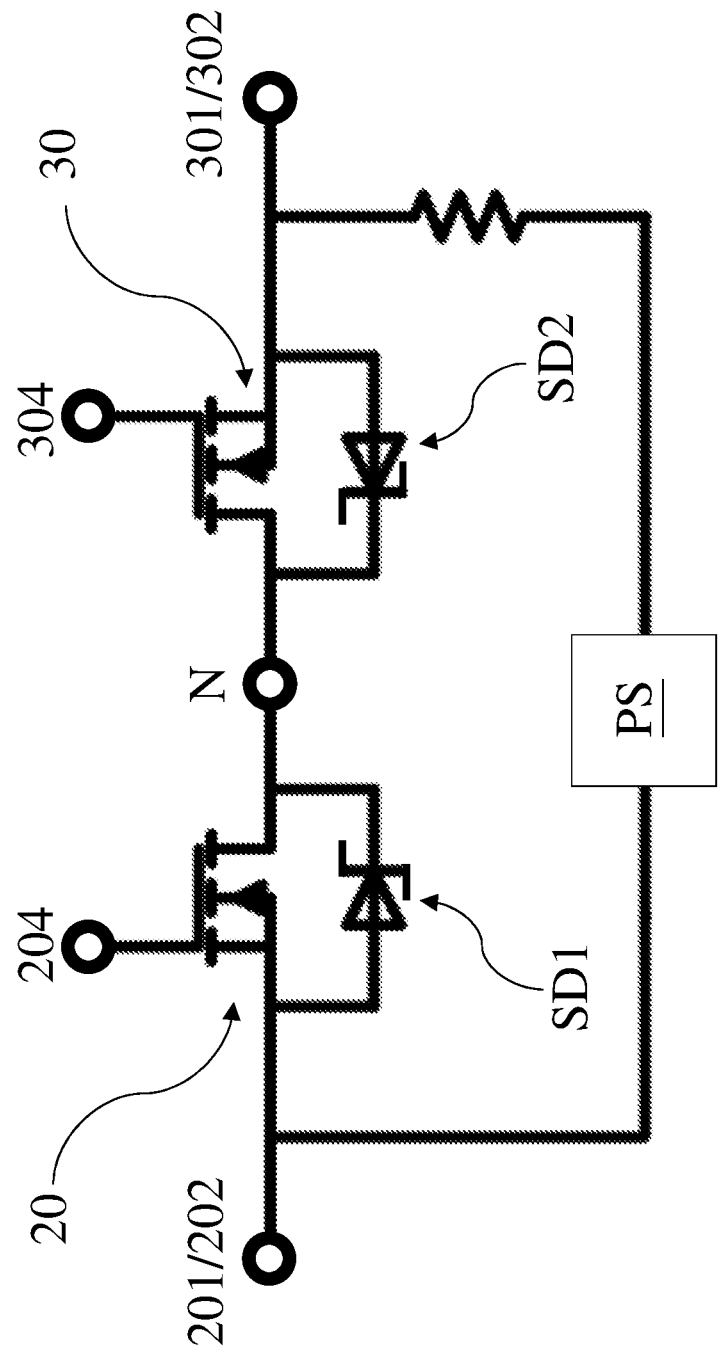
FIG. 1B is an equivalent circuit diagram of the semiconductor device of FIG. 1A.

By such the configuration, a bidirectional switch circuit can be achieved. To illustrate, FIG. 1B is an equivalent circuit diagram of the semiconductor device 1A of FIG. 1A. The equivalent circuit constituted by the nitride-based transistors 20 and 30 can serve as a bidirectional switch circuit of the semiconductor device 1A.

With respect to the nitride-based transistor 20, since the electrodes 201 and 202 are electrically coupled with each other, the voltage level (i.e., electric potential) of the electrodes 201 and 202 can be substantially the same. Accordingly, the electrodes 201 and 202 can be connected to the same node in the equivalent circuit. Moreover, as the electrodes 201 and 202 are in contact with the nitride-based semiconductor layer 16 to form electrical connection, the electrodes 201 and 202 and the anode of the Schottky diode SD1 can be connected to the same node. As such, the Schottky diode SD1 is connected in parallel to the channel of the nitride-based transistor 20.

With respect to the nitride-based transistor 30, since the electrodes 301 and 302 are electrically coupled with each other, the voltage level (i.e., electric potential) of the electrodes 301 and 302 can be substantially the same. Accordingly, the electrodes 301 and 302 can be connected to the same node in the equivalent circuit. Moreover, as the electrodes 301 and 302 are in contact with the nitride-based semiconductor layer 16 to form electrical connection, the electrodes 301 and 302 and the anode of the Schottky diode SD2 can be connected to the same node. As such, the Schottky diode SD2 is connected in parallel to the channel of the nitride-based transistor 30.

Since the portions P1 and P2 of the nitride-based semiconductor layer 16 can serve as cathodes of the Schottky diodes SD1 and SD2, which are connected to each other by the portion P3 of the nitride-based semiconductor layer 16, the Schottky diodes SD1 and SD2 are connected to the same node N. More specifically, the cathodes of the Schottky diodes SD1 and SD2 are connected to the same node N.

To operate the semiconductor device 1A, a power source PS can be used. The power source PS is electrically coupled with the semiconductor device 1A. The power source PS can serve as an external power source. Two poles of the power source PS can be respectively connected to the nitride-based transistors 20 and 30. One of the poles of the power source PS can be connected to the electrodes 201 and 202 of the nitride-based transistor 20 through the conduction bridge 208 (i.e., by physical connection). Another one of the poles of the power source PS can be connected to the electrodes 301 and 302 of the nitride-based transistor 30 through the conduction bridge 308. A resistor can be connected to the power source PS in series.

Figure 2A:
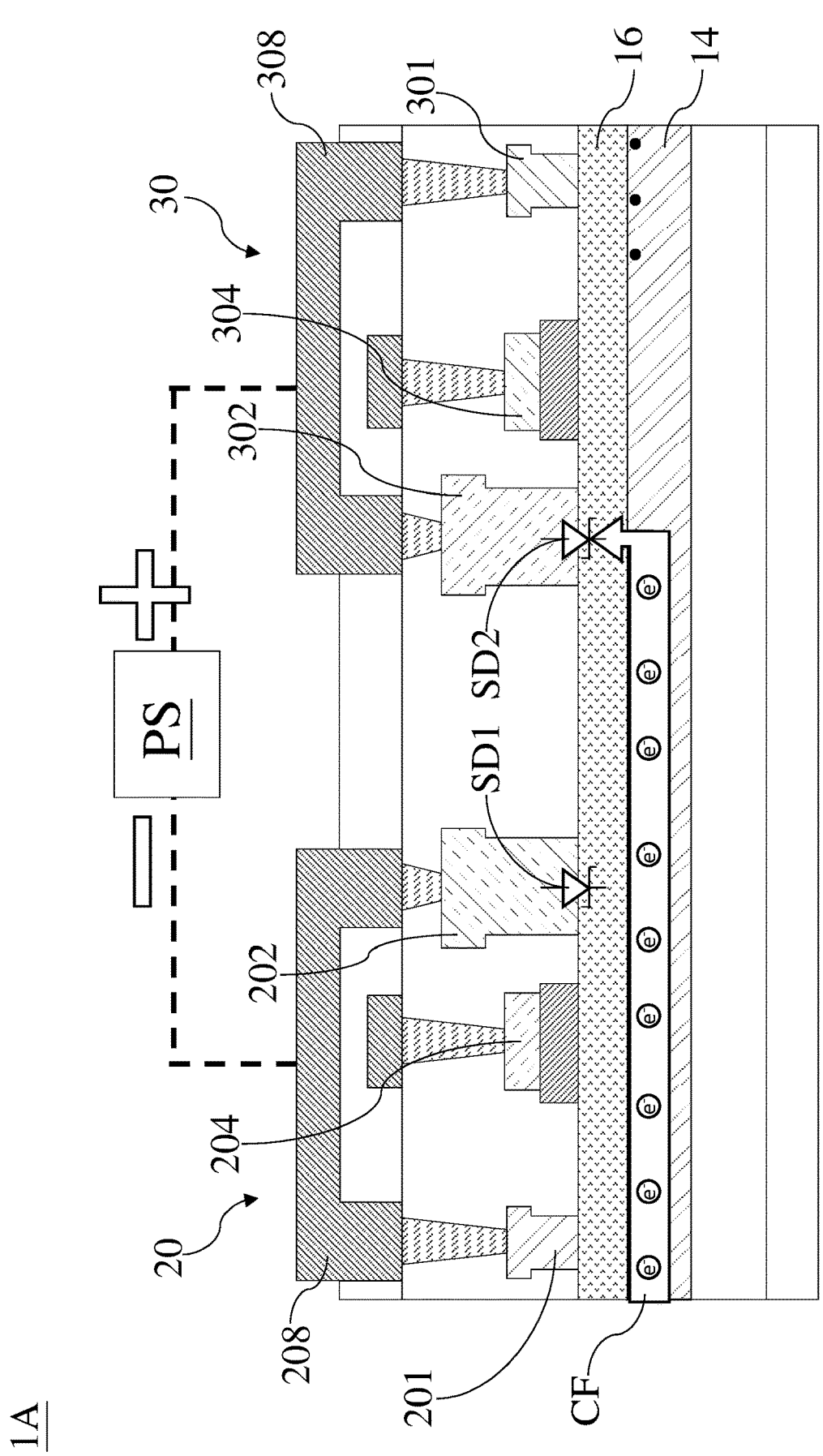
FIG. 2A and FIG. 2B are schematic diagrams of a semiconductor device during an operation according to some embodiments of the present disclosure.
Figure 2B:
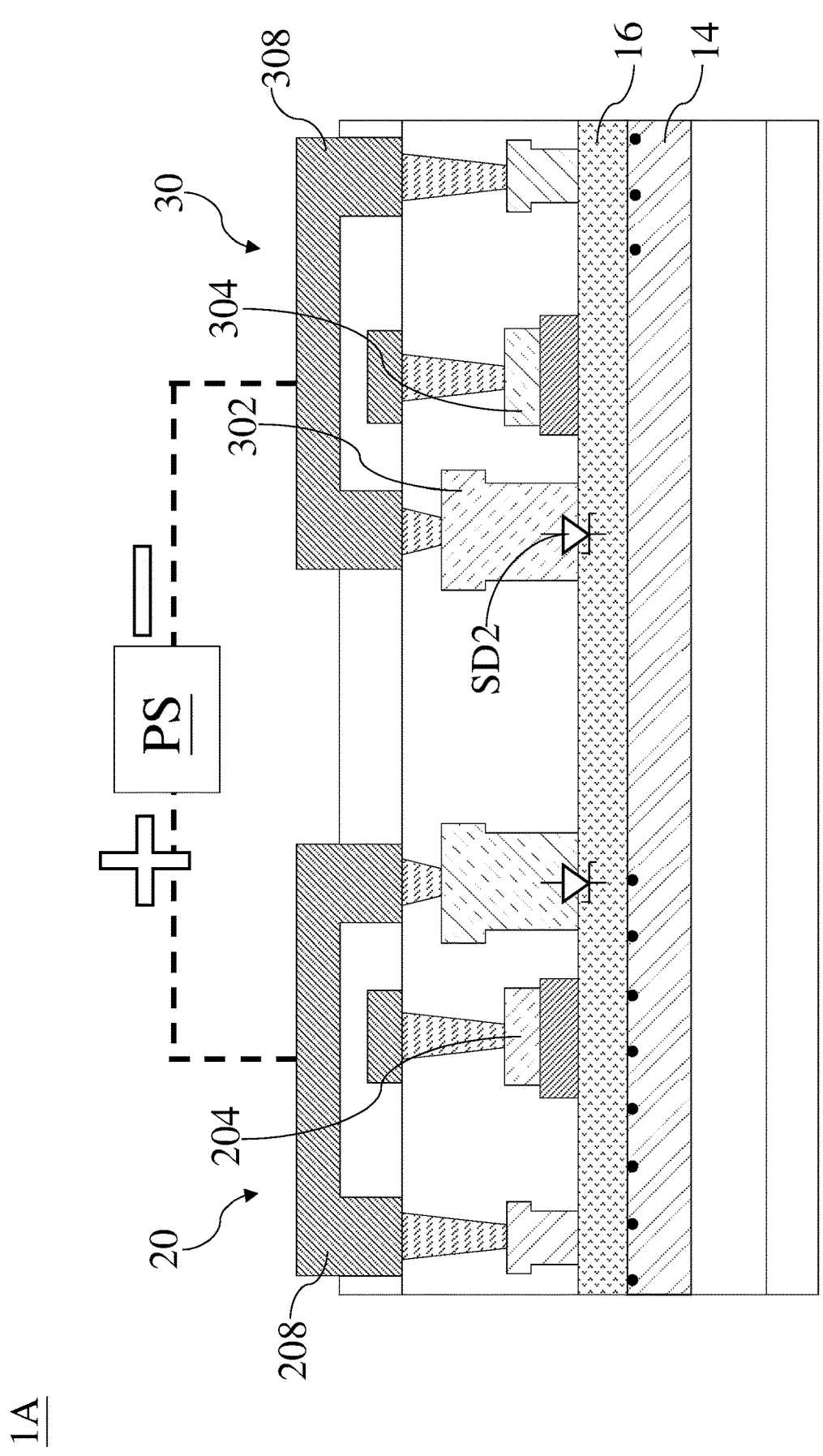

FIG. 2A and FIG. 2B are schematic diagrams of a semiconductor device 1A during an operation according to some embodiments of the present disclosure. FIG. 2A depicts a status that the semiconductor device 1A allows a carrier flow to pass through. FIG. 2B depicts a status that the semiconductor device 1A cuts a carrier flow path off.

During the operation in FIG. 2A, a positive bias and a negative bias are applied to the gate electrodes 204, 304, respectively, so the nitride-based transistor 20 can be brought into a switch-on state and the nitride-based transistor 30 can be brought into a switch-off state. The power source PS applies a negative voltage level to the conduction bridge 208 and a positive voltage level to the conduction bridge 308. In response to the output of the power source PS, the Schottky diode SD1 is turned off, so that electron is hard to flow from the nitride-based semiconductor layer 16 to the electrode 202 and that current is hard to flow from the electrode 202 to the nitride-based semiconductor layer 16. Also, in response to the output of the power source PS, the Schottky diode SD2 is turned on, so that electron is allowed to flow from the nitride-based semiconductor layer 16 to the electrode 302 and that current is allowed to flow from the electrode 302 to the nitride-based semiconductor layer 16.

During the operation, a carrier flow CF (i.e., electron flow) is introduced into the nitride-based transistor 20. Since the Schottky diode SD1 is turned off, the carrier flow CF passes through the nitride-based transistor 20 via the channel of the nitride-based transistor 20 (i.e., along the 2DEG region). Although the nitride-based transistor 30 is brought into a switch-off state, the carrier flow CF can enter the electrode 302 via the Schottky diode SD2. Thereafter, by the connection bridge 308, the carrier flow CF can be directed to the electrode 301. Therefore, the carrier flow CF is allowed to flow along a direction from left to right. The semiconductor device 1A can be in a unidirectional conduction mode. It should be noted that the power consumption of the semiconductor device 1A can be reduced due to the small turn-on voltage of the Schottky diode SD2.

During the operation in FIG. 2B, a positive bias and a negative bias are still applied to the gate electrodes 204, 304 respectively, so the nitride-based transistor 20 can be brought into a switch-on state and the nitride-based transistor 30 can be brought into a switch-off state. The power source PS applies a positive voltage level to the conduction bridge 208 and a negative voltage level to the conduction bridge 308. In response to the output of the power source PS, the Schottky diode SD2 is turned off, so that electron is hard to flow from the nitride-based semiconductor layer 16 to the electrode 302 and that current is hard to flow from the electrode 302 to the nitride-based semiconductor layer 16.

As the nitride-based transistor 30 is brought into a switch-off state and the Schottky diode SD2 is turned off, due to the built-in voltage of the Schottky diode SD2, even though a carrier flow (i.e., electron flow) is introduces as aforementioned, the carrier flow might be hindered by the Schottky diode SD2. The carrier flow is hard to flow to the electrode 301. Thus, the semiconductor device 1A is in a cut-off mode.

The exemplary operation above describes how the semiconductor device 1A leads a carrier flow from left to right. Similarly, at the operation mode that the condition is opposite, an introduced carrier flow can flow along a opposite direction (i.e., a direction from right to left). As such, the function of the bidirectional switch circuit can be realized. The bidirectional switch circuit can be realized in a small volume. Furthermore, the power consumption of the semiconductor device 1A can be reduced due to the introduction of the Schottky diode.

Referring back to FIG. 1A, the semiconductor device 1A further includes dielectric layers 40, 42, a passivation layer 44, and a dielectric layer 46.

The dielectric layer 40 can be disposed on/over/above the nitride-based semiconductor layer 16 and the gate structures. The dielectric layer 40 can cover the gate structures, so as to form protruding portions. The dielectric layer 40 can be conformally disposed with the gate electrode 32 and the doped nitride-based semiconductor layer 30. The electrodes 201 and 301 can penetrate the dielectric layer 40 to make contact with the nitride-based semiconductor layer 16.

The material of the dielectric layer 40 can include, for example but are not limited to, dielectric materials. For example, the dielectric layer 40 can include, for example but are not limited to, $SiN_x$, $SiO_x$, $Si_3N_4$, SiON, SiC, SiBN, SiCBN, oxides, nitrides, plasma enhanced oxide (PEOX), or combinations thereof. In some embodiments, the dielectric layer 40 can be a multi-layered structure, such as a composite dielectric layer of $Al_2O_3$/SiN, $Al_2O_3$/$SiO_2$, AlN/SiN, AlN/$SiO_2$, or combinations thereof.

The dielectric layer 42 can be disposed on/over/above the dielectric layer 40 and the electrodes 201 and 301. The electrodes 202 and 302 can penetrate the dielectric layer 42 to make contact with the nitride-based semiconductor layer 16. The exemplary materials of the dielectric layer 42 can be identical with or similar with that of the dielectric layer 40.

The passivation layer 44 can be disposed on/over/above the dielectric layer 42. The electrodes 202 and 302 can penetrate the dielectric layer 44. The conductive vias 205, 206, 207, 305, 306, 307 can be within the passivation layer 44. The upper surfaces of the conductive vias 205, 206, 207, 305, 306, 307 are free from coverage by the passivation layer 44.

The exemplary material of the passivation layer 44 can be identical with or similar with that of the dielectric layer 50. Moreover, the passivation layer 44 can serve as a planarization layer which has a level top surface to support other layers/elements. In some embodiments, the passivation layer 44 can be formed as a thicker layer, and a planarization process, such as chemical mechanical polish (CMP) process, is performed on the passivation layer 44 to remove the excess portions, thereby forming a level top surface.

The dielectric layer 46 can be disposed on/over/above the passivation layer 44. The dielectric layer 46 can cover the conductive pads 209 and 309. The connection bridges 208 and 308 can penetrate the dielectric layer 46. The connection bridges 208 and 308 can extend along a top surface of the dielectric layer 46.

Different stages of a method for manufacturing the semiconductor device 1A are shown in FIG. 3A, FIG. 3B, FIG. 3C, and FIG. 3D, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 3A:
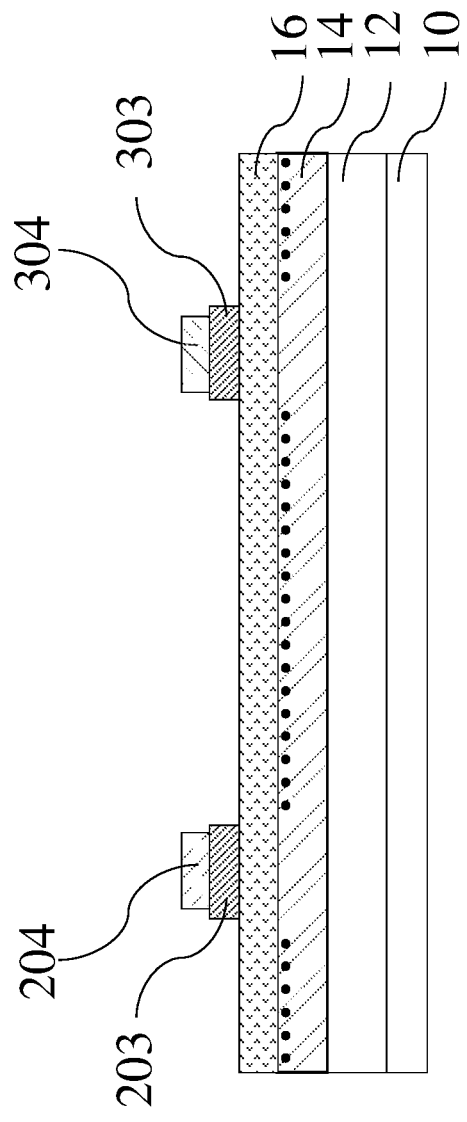
FIG. 3A, FIG. 3B, FIG. 3C, and FIG. 3D show different stages of a method for manufacturing a nitride-based semiconductor device according to some embodiments of the present disclosure.

Referring to FIG. 3A, a substrate 10 is provided. A buffer layer 12 can be formed on/over/above the substrate 10 by using deposition techniques. Nitride-based semiconductor layers 14 and 16 can be formed on/over/above the substrate 10 in sequence by using deposition techniques. The doped nitride-based semiconductor layers 203 and 303 can be formed on/over/above the nitride-based semiconductor layer 16. The gate electrodes 204 and 304 can be formed on/over/above the doped nitride-based semiconductor layers 203 and 303, respectively. The formation of the doped nitride-based semiconductor layers 203 and 303 and the gate electrodes 208, 308 can include deposition techniques and the patterning process. In some embodiments, the deposition techniques can be performed for forming a blanket layer. In some embodiments, the deposition techniques can be performed for forming a blanket layer, and the patterning process can be performed for removing excess portions thereof.

Figure 3B:
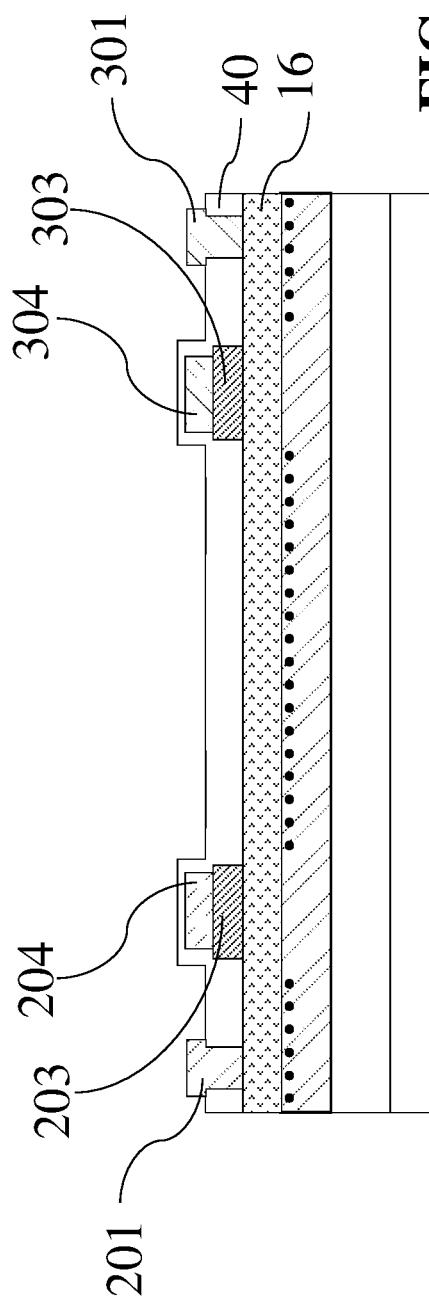

Referring to FIG. 3B, a dielectric layer 40 can be formed on/over/above the nitride-based semiconductor layer 16 to cover the gate electrodes 204 and 304 and the doped nitride-based semiconductor layers 203 and 303. In some embodiments, some portions of the dielectric layer 40 can be removed to form ohmic regions to expose some portions of the nitride-based semiconductor layer 16. The electrodes 201 and 301 can be formed within the ohmic regions, such that each of the electrodes 201 and 301 can make contact with the nitride-based semiconductor layer 16.

Figure 3C:
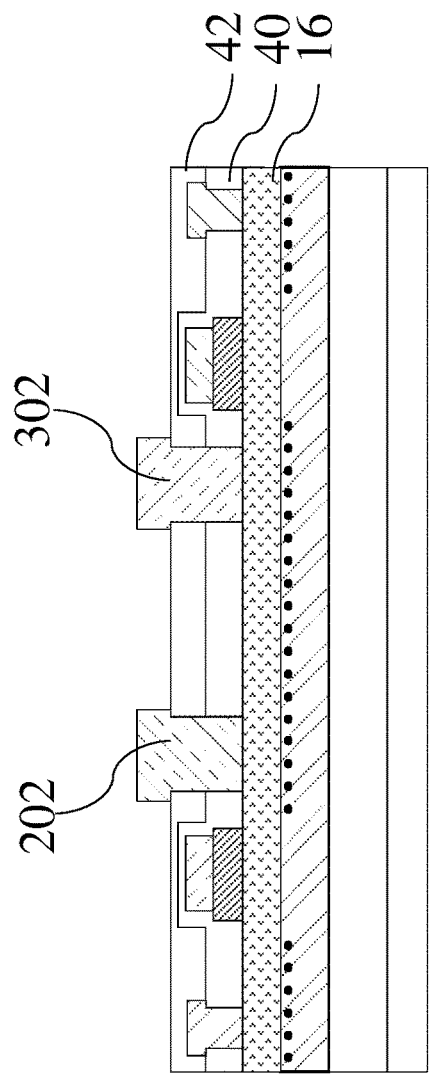

Referring to FIG. 3C, a dielectric layer 42 is formed to cover the resulted structure of the FIG. 3B. A patterning process can be performed on the dielectric layers 40 and 42 to expose the nitride-based semiconductor layer 16. Thereafter, electrodes 202 and 302 are formed to make contact with the nitride-based semiconductor layer 16.

Figure 3D:
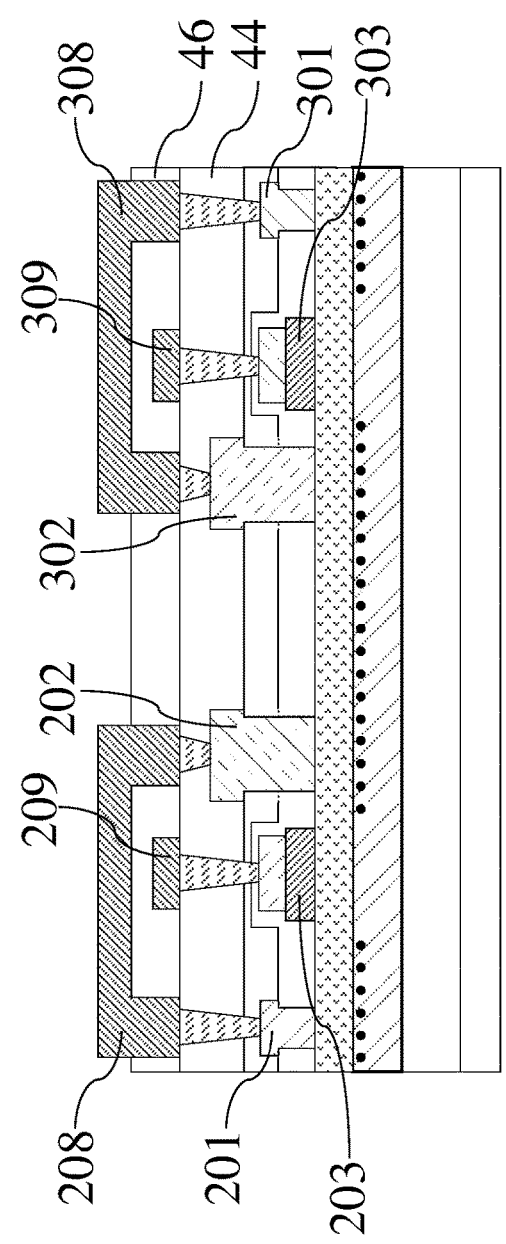

Referring to FIG. 3D, a passivation layer 44 and a dielectric layer 46, and contact vias are formed. Prior to the formation of the passivation layer 46, conductive pads 209 and 309 are formed to electrically couple with the gate electrodes 204 and 304. After the formation of the passivation layer 46, the conduction bridges 208 and 308 are formed such that the electrodes 201 and 202 can be electrically connected to each other via the conduction bridge 208 and that the electrodes 301 and 302 can be electrically connected to each other via the conduction bridge 308. After the formation of the conduction bridges 208 and 308, the configuration of the semiconductor device 1A as shown in FIG. 1A can be obtained.

Figure 4:
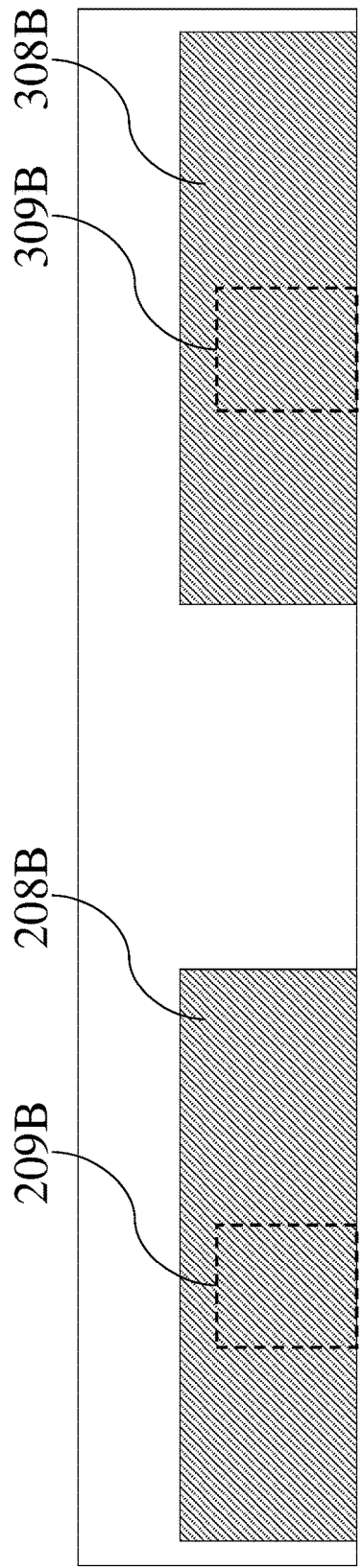
FIG. 4 is a partial top view of a semiconductor device 1B according to some embodiments of the present disclosure.

FIG. 4 is a partial top view of a semiconductor device 1B according to some embodiments of the present disclosure. FIG. 4 depicts a relationship between a conduction bridge 208B and a conductive pad 209B and a relationship between a conduction bridge 308B and a conductive pad 309B. Other layers/elements of the semiconductor device 1B can be identical with or similar to the semiconductor device 1A as described and illustrated with reference to FIG. 1A. As shown in FIG. 4, the conduction bridge 208B laterally extends across the conductive pad 209B, so they overlap with each other in the top view. The conduction bridge 308B laterally extends across the conductive pad 309B, so they overlap with each other in the top view. Such the configuration can keep the width of the semiconductor device 1B in desired dimension.

Figure 5:
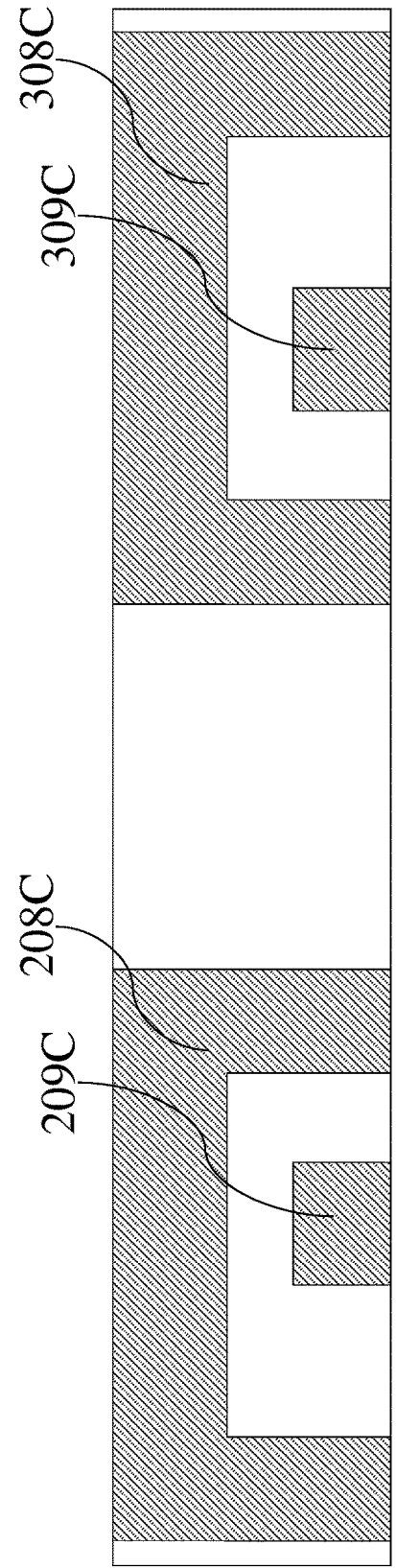
FIG. 5 is a partial top view of a semiconductor device 1B according to some embodiments of the present disclosure.

FIG. 5 is a partial top view of a semiconductor device 1C according to some embodiments of the present disclosure. FIG. 5 depicts a relationship between a conduction bridge 208C and a conductive pad 209C and a relationship between a conduction bridge 308C and a conductive pad 309C. Other layers/elements of the semiconductor device 1C can be identical with or similar to the semiconductor device 1A as described and illustrated with reference to FIG. 1A. As shown in FIG. 5, the conduction bridge 208C is separated from the conductive pad 209C in the top view. The conduction bridge 208C extends to enclose/surround the conductive pad 209C. The conduction bridge 308C is separated from the conductive pad 309C in the top view. The conduction bridge 308C extends to enclose/surround the conductive pad 309C. Such the configuration can reduce parasitic capacitance between the conduction bridge 208C and the conductive pad 209C or between the conduction bridge 308C and a conductive pad 309C.

Based on the above descriptions, in the present disclosure, the two nitride-based transistors can apply different parts of the 2DEG region as respective channels. Schottky diodes are introduced into the nitride-based transistors, in which cathodes of the Schottky diodes can be connected to the same node. By switching on or off of the nitride-based transistors and turning on or off the Schottky diodes, the semiconductor device can serve as a bidirectional switch circuit. It is advantageous to reduce the power consumption due to the introduction of the Schottky diodes.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 11 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device comprising:
a first nitride-based semiconductor layer;
a second nitride-based semiconductor layer disposed on the first nitride-based semiconductor layer and having a bandgap greater than a bandgap of the first nitride-based semiconductor layer, so as to form a heterojunction and a two-dimensional electron gas (2DEG) region adjacent to the heterojunction;
a first nitride-based transistor applying the 2DEG region as a channel thereof and comprising a first drain electrode that makes contact with the second nitride-based semiconductor layer to form a first Schottky diode with the second nitride-based semiconductor layer; and
a second nitride-based transistor applying the 2DEG region as a channel thereof and comprising a second drain electrode that makes contact with the second nitride-based semiconductor layer to form a second Schottky diode with the second nitride-based semiconductor layer, such that the first Schottky diode and the second Schottky diode are connected to the same node.

2. The nitride-based semiconductor device of claim 1, wherein the first nitride-based transistor further comprises:
a first source electrode disposed over the second nitride-based semiconductor layer; and
a first connection bridge electrically connecting the first drain electrode to the first source electrode.

3. The nitride-based semiconductor device of claim 2, wherein the first nitride-based transistor further comprises:
a first gate electrode disposed over the second nitride-based semiconductor layer; and
a first doped nitride-based semiconductor layer disposed between the second nitride-based semiconductor layer and the first gate electrode, wherein the first connection bridge extends across the first gate electrode and the first doped nitride-based semiconductor layer.

4. The nitride-based semiconductor device of claim 2, wherein the second nitride-based transistor further comprises:
a second source electrode disposed over the second nitride-based semiconductor layer; and
a second connection bridge electrically connecting the second drain electrode to the second electrode.

5. The nitride-based semiconductor device of claim 1, wherein the first drain electrode serves as an anode for the first Schottky diode, and a first portion of the second nitride-based semiconductor layer in contact with the first drain electrode serves as a cathode for the first Schottky diode.

6. The nitride-based semiconductor device of claim 5, wherein the second drain electrode serves as an anode for the second Schottky diode, and a second portion of the second nitride-based semiconductor layer in contact with the second drain electrode serves as a cathode for the second Schottky diode.

7. The nitride-based semiconductor device of claim 6, wherein the cathodes of the first and second Schottky diodes are connected to the same node.

8. The nitride-based semiconductor device of claim 7, wherein the second nitride-based semiconductor layer has a third portion connecting the first portion to the second portion of the second nitride-based semiconductor layer.

9. The nitride-based semiconductor device of claim 1, wherein the first drain electrode and the second nitride-based semiconductor layer collectively form a first Schottky junction, wherein the first Schottky diode is across the first Schottky junction.

10. The nitride-based semiconductor device of claim 1, wherein the second drain electrode and the second nitride-based semiconductor layer collectively form a second Schottky junction, wherein the second Schottky diode is across the second Schottky junction.

11. The nitride-based semiconductor device of claim 1, wherein the first nitride-based transistor further comprises a first source electrode and a first gate electrode between the first source electrode and the first drain electrode.

12. The nitride-based semiconductor device of claim 11, wherein the second nitride-based transistor further comprises a second source electrode and a second gate electrode between the second source electrode and the second drain electrode, wherein the first and second drain electrodes are located between the first and second gate electrodes.

13. The nitride-based semiconductor device of claim 1, wherein the first nitride-based transistor further comprises a first source electrode in contact with the second nitride-based semiconductor layer, wherein the second nitride-based transistor further comprises a second source electrode in contact with the second nitride-based semiconductor layer.

14. The nitride-based semiconductor device of claim 13, wherein each of the first and second source electrodes forms an ohmic contact with the second nitride-based semiconductor layer.

15. The nitride-based semiconductor device of claim 1, wherein each of the first and second drain electrodes comprises titanium nitride.

16. A method for manufacturing a nitride-based semiconductor device, comprising:
forming a second nitride-based semiconductor layer on a first nitride-based semiconductor layer;
forming a first nitride-based transistor over the second nitride-based semiconductor layer, comprising forming a first Schottky contact between a first drain electrode and the second nitride-based semiconductor layer;
forming a first connection bridge to connect the first drain electrode and a first source electrode of the first nitride-based transistor;
forming a second nitride-based transistor over the second nitride-based semiconductor layer, comprising forming a second Schottky contact between a second drain electrode and the second nitride-based semiconductor layer; and
forming a second connection bridge to connect the second drain electrode and a second source electrode of the second nitride-based transistor;
the method further comprises:
forming a first doped nitride-based semiconductor layer over the second nitride-based semiconductor layer; and
forming a first gate electrode on the first doped nitride-based semiconductor layer prior to the formation of the first source electrode and the first drain electrode.

17. The method of claim 16, further comprising:
forming a first blanket conductive layer above the second nitride-based semiconductor layer; and
patterning the first blanket conductive layer to form the first drain electrode and the second drain electrode.

18. The method of claim 17, further comprising:
forming a second blanket conductive layer above the second nitride-based semiconductor layer, wherein the first and second blanket conductive layer have different conductive materials; and
patterning the second blanket conductive layer to form the first source electrode and the second source electrode.

19. The method of claim 16, wherein the first and second source electrode are formed prior to the formation of the first and second drain electrodes.

* * * * *